(12) United States Patent
Feng

(10) Patent No.: US 11,283,051 B2
(45) Date of Patent: Mar. 22, 2022

(54) THIN FILM PACKAGING LAYER COATED DISPLAY PANEL AND DISPLAY DEVICE

(71) Applicant: KUNSHAN GO-VISIONOX OPTO-ELECTRONICS CO., LTD, Jaingsu (CN)

(72) Inventor: Dandan Feng, Jiangsu (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 34 days.

(21) Appl. No.: 16/816,592

(22) Filed: Mar. 12, 2020

(65) Prior Publication Data

US 2020/0212365 A1    Jul. 2, 2020

Related U.S. Application Data

(63) Continuation of application No. PCT/CN2019/074151, filed on Jan. 31, 2019.

(30) Foreign Application Priority Data

Aug. 31, 2018 (CN) .......................... 201811015082.1

(51) Int. Cl.
*H01L 51/52* (2006.01)
*H01L 27/32* (2006.01)
(Continued)

(52) U.S. Cl.
CPC ...... *H01L 51/5275* (2013.01); *H01L 27/3244* (2013.01); *H01L 27/3281* (2013.01);
(Continued)

(58) Field of Classification Search
CPC ............. H01L 51/5275; H01L 51/5206; H01L 51/5253; H01L 51/5256; H01L 23/562;
(Continued)

(56) References Cited

U.S. PATENT DOCUMENTS 6,285,039 B1 *   9/2001 Kobori ................... C09K 11/06
                                                              257/103
9,165,986 B2 * 10/2015 Lin ...................... H01L 51/5275
(Continued)

FOREIGN PATENT DOCUMENTS

CN          102820433 A        12/2012
CN          103227291 A         7/2013
(Continued)

OTHER PUBLICATIONS

Office Action issued in corresponding Japanese Patent Application No. 2020-529287 dated Feb. 16 2021with English translation thereof.
(Continued)

*Primary Examiner* — Ida M Soward
(74) *Attorney, Agent, or Firm* — Ladas & Parry LLP

(57) ABSTRACT

A display panel includes a substrate, an organic light emitting structure, a first electrode, a light extraction layer, a protection layer, and a thin film packaging layer, which are stacked in sequence. The organic light emitting structure, the first electrode, the light extraction layer and the protection layer are coated by the thin film packaging layer. The light extraction layer is located between the protection layer and the first electrode, and completely isolates the protection layer and the first electrode.

15 Claims, 3 Drawing Sheets

(51) Int. Cl.
*H01L 33/44* (2010.01)
*H01L 23/00* (2006.01)
(52) U.S. Cl.
CPC ...... *H01L 51/5206* (2013.01); *H01L 51/5253* (2013.01); *G09G 2330/04* (2013.01); *H01L 23/562* (2013.01); *H01L 23/564* (2013.01); *H01L 33/44* (2013.01); *H01L 51/5221* (2013.01); *H01L 51/5262* (2013.01); *H01L 2251/301* (2013.01); *H01L 2251/308* (2013.01)
(58) Field of Classification Search
CPC ............... H01L 23/564; H01L 27/3244; H01L 27/3281; H01L 33/44; H01L 51/5262; H01L 51/5221; H01L 2251/301; H01L 2251/308; G09G 2330/04
See application file for complete search history.

(56) References Cited

U.S. PATENT DOCUMENTS

| | | | | |
|---|---|---|---|---|
| 9,196,863 | B2* | 11/2015 | Sin | H01L 51/5253 |
| 9,871,225 | B2* | 1/2018 | Kuroki | H01L 51/5253 |
| 10,069,099 | B2* | 9/2018 | Ishidai | H01L 51/5206 |
| 10,263,214 | B2* | 4/2019 | Riegel | H01L 51/5253 |
| 10,461,268 | B2* | 10/2019 | Jiang | H01L 51/0097 |
| 10,516,134 | B2* | 12/2019 | Ochi | H01L 27/1248 |
| 10,600,982 | B2* | 3/2020 | Ishida | H01L 51/5234 |
| 10,608,062 | B2* | 3/2020 | Takahashi | H05B 33/04 |
| 11,069,877 | B2* | 7/2021 | Sonoda | H01L 51/56 |
| 2006/0186802 | A1 | 8/2006 | Cok et al. | |
| 2007/0159095 | A1 | 7/2007 | Matsuda et al. | |
| 2008/0054795 | A1* | 3/2008 | Ohmi | H01L 51/5206 313/504 |
| 2014/0070195 | A1* | 3/2014 | Choi | H01L 51/5256 257/40 |
| 2014/0138636 | A1* | 5/2014 | Song | H01L 51/5262 257/40 |
| 2014/0225098 | A1* | 8/2014 | Lee | H01L 51/5268 257/40 |
| 2015/0236304 | A1 | 8/2015 | Negishi et al. | |
| 2015/0263311 | A1* | 9/2015 | Park | C08J 3/02 257/40 |
| 2015/0348803 | A1* | 12/2015 | Moro | H01L 51/5246 257/790 |
| 2016/0087242 | A1* | 3/2016 | Chen | H01L 51/0097 257/100 |
| 2016/0095172 | A1* | 3/2016 | Lee | C23C 16/401 313/504 |
| 2016/0181569 | A1* | 6/2016 | Wu | C08L 29/04 257/40 |
| 2017/0005292 | A1* | 1/2017 | Lee | H01L 51/5256 |
| 2017/0018737 | A1 | 1/2017 | Kim et al. | |
| 2017/0062534 | A1* | 3/2017 | Jiang | H01L 51/5253 |
| 2017/0133632 | A1* | 5/2017 | Yang | H01L 51/56 |
| 2017/0222176 | A1 | 8/2017 | Hayk et al. | |
| 2017/0331064 | A1* | 11/2017 | Trummer-Sailer | H01L 51/504 |
| 2018/0097034 | A1* | 4/2018 | Lee | H01L 27/3276 |
| 2018/0166653 | A1* | 6/2018 | Xie | B32B 27/08 |
| 2019/0211219 | A1* | 7/2019 | Kondo | H05B 33/10 |
| 2019/0252641 | A1* | 8/2019 | Zhang | H01L 51/524 |
| 2020/0308329 | A1* | 10/2020 | Rogojina | H01L 51/5253 |

FOREIGN PATENT DOCUMENTS

| | | |
|---|---|---|
| CN | 106816549 A | 6/2017 |
| CN | 106935633 A | 7/2017 |
| CN | 107863375 A | 3/2018 |
| CN | 108336241 A | 7/2018 |
| CN | 109148728 A | 1/2019 |
| JP | 2013-149594 A | 8/2013 |
| KR | 10-2006-0084978 A | 7/2006 |
| TW | 1463452 B | 12/2014 |
| TW | 1545823 | 8/2016 |
| TW | 201725717 A | 7/2017 |

OTHER PUBLICATIONS

Office Action issued in corresponding Korean Patent Application No. 10-2020-7015308 dated Feb. 24, 2021 with English translation thereof.
JP 2013-149594 A dated Aug. 1, 2013 English Translation.
KR 10-2006-0084978 A dated Jul. 26, 2006 English Translation.
ISR for International Application PCT/CN2019/074151dated Apr. 28, 2019.
CN 109148728 A—English Abstract dated Jan. 4, 2019.
CN 108336241 A—English Abstract dated Jul. 27, 2018.
CN 103227291 A—English Abstract dated Jul. 31, 2013.
CN 106935633 A—English Abstract dated Jul. 7, 2017.
CN 107863375 A—English Abstract dated Mar. 30, 2018.
Office Action issued in corresponding China Patent Application No. 201811015082.1 dated May 8, 2019 with English translation thereof.
Office Action issued in corresponding Taiwan Patent Application No. 108106358 dated Oct. 3, 2019, along with English translation thereof.
Another Office Action issued in corresponding Taiwan Patent Application No. 108106359 dated Jul. 8, 2019, along with English translation thereof.
English translation of the abstract of CN102820433A dated Dec. 12, 2012.
English translation of the abstract of CN106816549A dated Jun. 9, 2017.
English translation of the abstract of TW1463452B dated Jul. 16, 2017.
English translation of the abstract of TW1545823B dated Aug. 2016.
English translation of the abstract of TW2017025717A dated Dec. 1, 2014.
Office Action dated Oct. 5, 2021 issued in corresponding Japanese Patent Application No. 2020-529287 with English translation.

* cited by examiner

THIN FILM PACKAGING LAYER COATED DISPLAY PANEL AND DISPLAY DEVICE

CROSS-REFERENCE TO RELATED APPLICATIONS

This application is a Continuation Application of International Patent Application PCT/CN2019/074151, filed on Jan. 31, 2019, which claims priority to Chinese patent application No. 201811015082.1 filed on Aug. 31, 2018, contents of both of which are incorporated herein by reference in their entireties.

TECHNICAL FIELD

The present disclosure relates to a display technology, for example, a display panel and a display device.

BACKGROUND

An organic light emitting diode (OLED) display panel is a self-luminous display panel. Since the OLED display panel has the advantages such as lightness, high brightness, low power consumption, wide viewing angle, high response speed, and wide operating temperature range, the OLED display panel has increasingly being used in various high performance display fields. The thin film packaging method is often used in the related art to ensure that the organic light emitting structure is not corroded by moisture and oxygen in the external environment. Currently the thin film packaging technology generally employs a multilayer film structure in which an organic layer and an inorganic layer alternate. However, it is found by the inventor that employing the thin film packaging method in the related art often arises the problem of packaging failure.

SUMMARY

Provided is a display panel and a display device, so as to prevent a protection layer from corroding an electrode to affect the charge injection and fail the packaging, and improve the display performance of the display panel.

In one aspect, provided is a display panel, including a substrate, an organic light emitting structure, a first electrode, a light extraction layer, a protection layer, and a thin film packaging layer, which are stacked in sequence.

The organic light emitting structure, the first electrode, the light extraction layer and the protection layer are coated by the thin film packaging layer. The light extraction layer is located between the protection layer and the first electrode, and completely isolates the protection layer and the first electrode.

In one embodiment, along a direction parallel to a surface of the substrate, a distance between an edge of the light extraction layer and an edge of the thin film packaging layer is a first distance; a distance between an edge of the first electrode and the edge of the thin film packaging layer is a second distance; a distance between an edge of the protection layer and the edge of the thin film packaging layer is a third distance. The first distance is less than or equal to the second distance.

In one embodiment, the third distance is equal to the first distance.

Or, the third distance is equal to the second distance.

Or, the first distance is equal to the second distance and equal to the third distance.

Or, the third distance is less than the first distance, and the first distance is less than the second distance.

In one embodiment, the first distance is less than the second distance. The third distance is greater than the first distance, and less than the second distance.

In one embodiment, the first distance is equal to the second distance, and the third distance is less than the first distance.

In one embodiment, the first distance, the second distance and the third distance satisfy at least one of the following.

A minimum distance among the first distance, the second distance, and the third distance is greater than or equal to 100 micron, and less than or equal to 500 micron.

A maximum distance among the first distance, the second distance, and the third distance is less than or equal to 1 mm.

In one embodiment, a difference value between the second distance and the first distance is less than or equal to 900 micron.

In one embodiment, the difference value between the second distance and the first distance is less than or equal to 200 micron.

In one embodiment, a material adopted by the protection layer is lithium fluoride.

In one embodiment, a light transmittance of the first electrode is greater than 80%.

In one embodiment, a material of the first electrode comprises at least one of the following: a mixture of magnesium and silver, indium tin oxide, indium zinc oxide, silver-doped indium tin oxide, or sliver-doped indium zinc oxide.

In one embodiment, the display panel is a top-emitting active-matrix organic light emitting diode (AMOLED) display panel, and the first electrode is a negative electrode.

In one embodiment, the first electrode is a planar electrode.

In one embodiment, the display panel is a bottom-emitting AMOLED display panel or a passive matrix organic light emitting diode (PMOLED) display panel.

In one embodiment, the display panel is the PMOLED display panel, and the first electrode is a strip negative electrode.

In one embodiment, provided is a display device, including a display panel of any embodiment of the present disclosure.

DETAILED DESCRIPTION

The thin film packaging structure often results in the packaging failure. In the study, the inventor has found that the reason for such problem is that the thin film packaging structure usually includes an inorganic layer and an organic layer which are stacked in alternating manner. The inorganic layer functions to block water oxygen, and the common materials are $SiN_x$, $SiO_x$, $SiO_xN_y$, $Al_2O_3$ and $TiO_2$. The inorganic layer usually employs the preparation methods such as plasma enhanced chemical vapor deposition (PECVD), atomic layer deposition (ALD), pulsed laser deposition (PLD), or sputter. In order to avoid damage to the organic light emitting structure by ions in the preparation stage of inorganic layer, a protection layer is usually arranged between the thin film packaging structure and an electrode of the display panel. However, the protection layer material commonly used has the ions with a relatively high activity. Illustratively, the protection layer mostly employs a lithium fluoride material; the fluoride ion is relatively active, and easy to react with the electrode material of the display panel, consequently the electrode is corroded, the charge injection is affect and the product packaging is failed.

Accordingly, provided is a display panel, including a substrate, an organic light emitting structure, a first electrode, a light extraction layer, a protection layer, and a thin film packaging layer, which are stacked in sequence.

The organic light emitting structure, the first electrode, the light extraction layer and the protection layer are coated by the thin film packaging layer. The light extraction layer is located between the protection layer and the first electrode, and completely isolates the protection layer and the first electrode.

By arranging the light extraction layer located between the protection layer and the first electrode and completely isolating the protection layer and the first electrode, the protection layer does not contact the first electrode; the light extraction layer functions to block the relatively active ions in the protection layer, thereby effectively preventing the protection layer from corroding the first electrode to affect the charge injection and fail the packaging, and improving the display performance of the display panel. Moreover, the solution of the present disclosure only designs the existing film layer in the panel, no another film layer needs to be added, which ensures that the display panel has a relatively small thickness, and conforms to the development trending of the display panel being lighter and thinner.

Hereinafter the present disclosure will be further described in detail in conjunction with accompanying drawings and embodiments.

Figure 1:
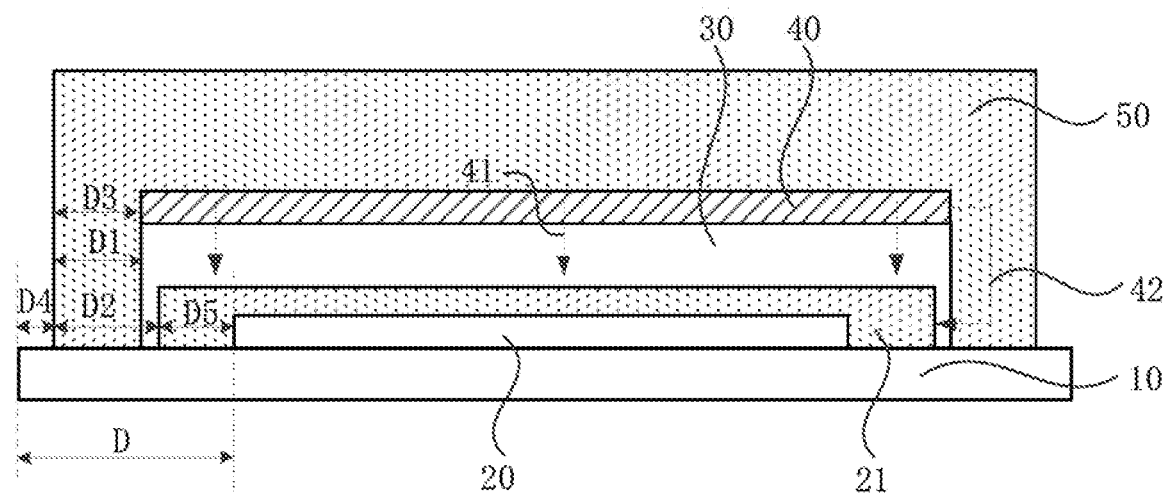
FIG. 1 is a schematic diagram illustrating a display panel provided by one embodiment.

A display panel is provided by one embodiment of the present disclosure. FIG. 1 is a schematic diagram illustrating a display panel provided by one embodiment. Referring to FIG. 1, the display panel includes a substrate 10o, an organic light emitting structure 20, a first electrode 21, a light extraction layer 30, a protection layer 40 and a thin film packaging layer 50, which are stacked in sequence.

The organic light emitting structure 20, the first electrode 21, the light extraction layer 30 and the protection layer 40 are coated by the thin film packaging layer 50.

Along a direction parallel to a surface of the substrate 10, a distance between an edge of the light extraction layer 30 and an edge of the thin film packaging layer 50 is a first distance D1, a distance between an edge of the first electrode 21 and the edge of the thin film packaging layer 50 is a second distance D2. The first distance D1 is less than or equal to the second distance D2.

The substrate 10 is an array substrate driving the organic light emitting structure 20 to emit light, and includes a display area and a non-display area. An area corresponding to the display area is provided with the organic light emitting structure 20, to realize the display of an image. An area corresponding to the non-display area does not display the image. The display panel may further include a second electrode (not shown in the drawings). The second electrode is arranged on one side of the organic light emitting structure 20 facing away the first electrode 21. The first electrode 21 may be a negative electrode, and the second electrode may be a positive electrode. Under the action of electrical signal applied by the first electrode 21 and the second electrode, the organic light emitting structure 20 emits the light with corresponding color. The light extraction layer 30 has a relatively high refractive index and a small absorption coefficient for improving the light extraction efficiency of the organic light emitting structure 20. The thin film packaging layer 50 covers the organic light emitting structure 20, and protects the organic light emitting structure 20 from the external moisture, the oxygen, and the like.

In addition, a material of the first electrode 21 is mostly a material of which a light transmittance is greater than 80% or greater than 90%, for example a mixture of magnesium and silver, indium tin oxide, indium zinc oxide, silver-doped indium tin oxide, or sliver-doped indium zinc oxide. The material of the first electrode 21 may be a metal material having a relatively large light transmittance such as aluminum. The fluoride ions in the protection layer 40 are easy to react with the first electrode 21, thereby corroding the first electrode 21, affecting the charge injection and failing the product package.

By arranging the first distance D less than or equal to the second distance D2, the first electrode 21 is completely covered by the light extraction layer 30, thereby completely isolating the protection layer 40 and the first electrode 21. The relatively active ions in the protection layer 40 are blocked, thereby effectively preventing the protection layer 40 from corroding the first electrode 21 to affect the charge injection and fail the packaging, and improving the display performance of the display panel.

In one embodiment, along the direction parallel to the surface of the substrate 10, a distance between an edge of the protection layer 40 and the edge of the thin film packaging layer 50 is a third distance D3. When the first distance D1 is equal to the second distance D2, the third distance D3 may be arranged to be less than or equal to the first distance D1. When the first distance D1 is less than the second distance D2, the third distance D3 only needs to be less than or equal to the second distance D2, for example, the third distance D3 may be arranged to be greater than the first distance D1 and less than the second distance D2. The following is described with accompanying drawings.

In one embodiment, referring to FIG. 1, the third distance D3 is equal to the first distance D1. Namely, sizes of the protection layer 40 and the light extraction layer 30 are the same. On one hand, the light extraction layer 30 can completely block the protection layer 40 in a direction perpendicular to the substrate 10, thereby preferably preventing the active ions in the protection layer 40 from reaching the first electrode 21 through a surface of the first electrode 21 parallel to the substrate 10 along the direction perpendicular to the substrate 10 (namely, reaching the first electrode 21 through a first path 41 in FIG. 1), thereby the effectively preventing the protection layer 40 from corroding the first electrode 21 to affect the charge injection and fail the packaging, and improving the display performance of the display panel. On the other hand, the sizes of the protection layer 40 and the light extraction layer 30 are the same, so that the protection layer 40 and the light extraction layer 30 may be fabricated by a same mask, which reduces the fabrication cost of the display panel.

In addition, referring to FIG. 1, while the third distance D3 is arranged to be equal to the first distance D1, the first distance D1 is arranged to be less than the second distance D2. At this moment, the light extraction layer 30 completely coats the first electrode 21, which can not only preferably prevent the active ions in the protection layer 40 from reaching the first electrode 21 along the first path 41, but also preferably prevent the active ions in the protection layer 40 from reaching the first electrode 21 along a side surface of the first electrode 21 perpendicular to the substrate 10 (namely reaching the first electrode 21 along a second path 42), thereby better preventing the protection layer 40 from corroding the first electrode 21 to affect the charge injection and fail the packaging, and improving the display performance of the display panel.

Figure 2:
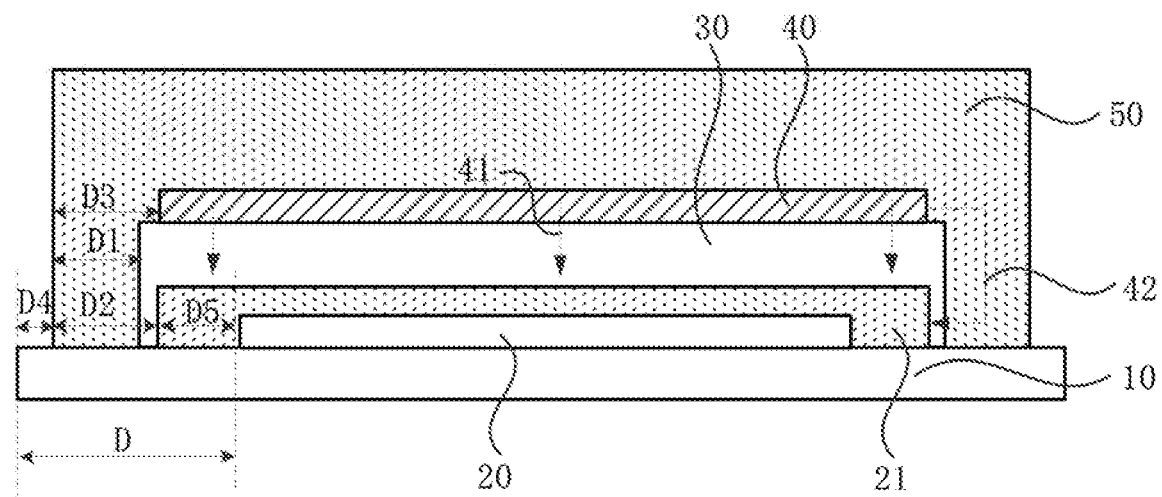
FIG. 2 is a schematic diagram illustrating another display panel provided by one embodiment.

FIG. 2 is a schematic diagram illustrating another display panel provided by one embodiment. In one embodiment, referring to FIG. 2, the third distance D3 is equal to the second distance D2.

In one embodiment, by arranging the third distance D3 equal to the second distance D2, namely, the sizes of the protection layer 40 and the first electrode 21 are the same, on one hand, while the protection layer 40 has a relatively small size, the protection layer 40 is ensured to protect the organic light emitting structure 20 from damage during the formation stage of the inorganic layer. In addition, by arranging the protection layer 40 having a relatively small size, the probability that the active ions in the protection layer 40 corrode the first electrode 21 is reduced. On the other hand, since the first distance D1 is less than or equal to the second distance D2, the third distance D3 is greater than or equal to the first distance D1, namely, the size of the protection layer 40 is less than or equal to the size of the light extraction layer 30. The light extraction layer 30 can completely block the protection layer 40 from the first electrode 21, which can preferably prevent the active ions in the protection layer 40 from reaching the first electrode 21 along the first path 41.

In addition, referring to FIG. 2, while the third distance D3 is equal to the second distance D2, the third distance D3 may be arranged to be greater than the first distance D1, at this moment, the light extraction layer 30 completely coats the first electrode 21, which can not only preferably prevent the active ions in the protection layer 40 from reaching the first electrode 21 along the first path 41, but also preferably prevent the active ions in the protection layer 40 from reaching the first electrode 21 along the second path 42, thereby better preventing the protection layer 40 from corroding the first electrode 21 to affect the charge injection and fail the packaging, and improving the display performance of the display panel.

Figure 3:
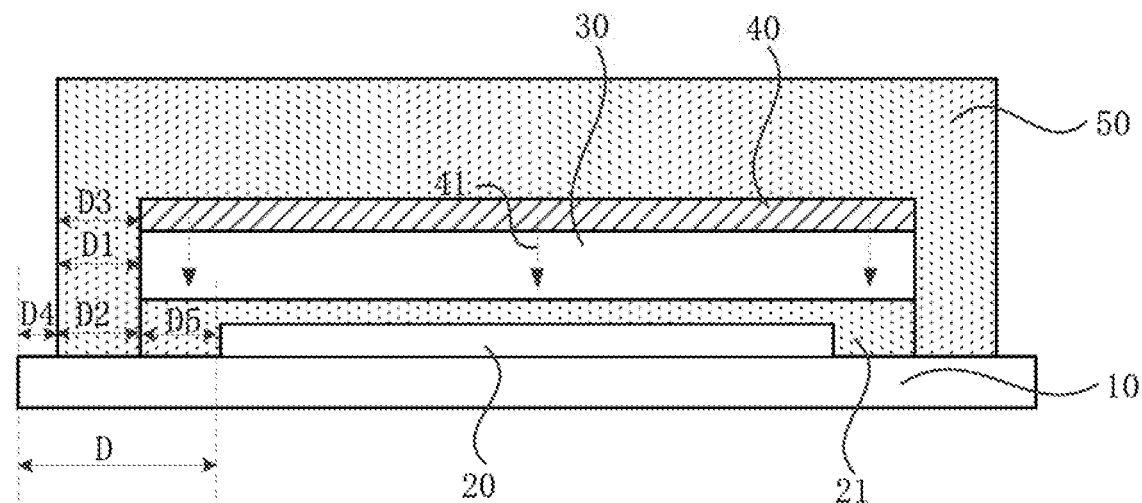
FIG. 3 is a schematic diagram illustrating still another display panel provided by one embodiment.

FIG. 3 is a schematic diagram illustrating still another display panel provided by one embodiment. In one embodiment, referring to FIG. 3, the first distance D1 is equal to the second distance D2 and the third distance D3.

In this way, the sizes of the first electrode 21, the light extraction layer 30 and the protection layer 40 are the same, which can preferably prevent the active ions in the protection layer 40 from reaching the first electrode 21 along the first path 41. Moreover, the first electrode 21, the light extraction layer 30 and the protection layer 40 may be fabricated by a same mask, which reduces the fabrication cost of the display panel.

Figure 4:
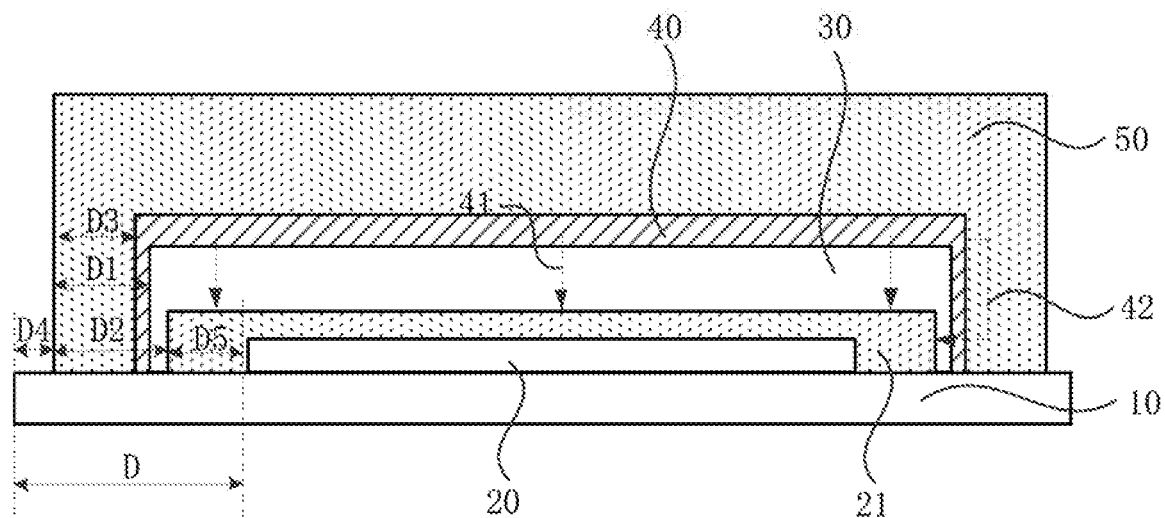
FIG. 4 is a schematic diagram illustrating still another display panel provided by one embodiment.

FIG. 4 is a schematic diagram illustrating still another display panel provided by one embodiment. In one embodiment, referring to FIG. 4, the distance between the edge of the protection layer 40 and the edge of the thin film packaging layer 50 is the third distance D3. The third distance D3 is less than the first distance D1, and the first distance D1 is less than the second distance D2.

In one embodiment, referring to FIG. 4, the first distance D1 is less than the second distance D2, namely, the light extraction layer 30 coats the organic light emitting structure 20. The third distance D3 is less than the first distance D1, namely, the protection layer 40 coats the light extraction layer 30. In this way, the protection layer 40 can fully prevent the organic light emitting structure 20 from damage during the preparation stage of the inorganic layer, and the light extraction layer 30 can also prevent the active ions in the protection layer 40 from corroding the first electrode 21 through the first path 41 and the second path 42, which can improve the display performance of the display panel.

In one embodiment, referring to FIG. 1 to FIG. 4, a border width D, of the display panel, D2+D4+D5. D4 is a distance between the edge of the thin film packaging layer 50 and an edge of the substrate 10. D5 is a distance between the edge of the organic light emitting structure 20 and the edge of the first electrode 21. Since the sizes of the organic light emitting structure 20 and the first electrode 21 are constant, D5 is constant. D4 is a size reserved for the cutting of the display panel during the fabrication stage of the display panel, thus D4 is constant. In order to ensure the thin film packaging effect, a minimum distance between the edges of the first electrode 21, the light extraction layer 30 and the protection layer 40 and the edge of the thin film packaging layer 50 may be arranged to be a set value a. In FIG. 1, the border width D=D1+(D2−D1)+D4+D5=a+(D2−D1)+D4+D5, and D2>D1=D3. In FIG. 2, the border width D=D1+(D2−D1)+D4+D5=a+(D2−D1)+D4+D5, and D2=D3>D1. In FIG. 3, the border width D=D=D1+D4+D5=a+D4+D5, and D2=D3=D. In FIG. 4, the border width D=D3+(D2−D3)+D4+D5=a+(D2−D1)+(D1-D3)+D4+D5, and D2>D1>D3. Thus, the display panel provided by the solution shown in FIG. 3 has a narrowest border, the display panel provided by the solution shown in FIG. 2 and FIG. 1 has a relatively narrow border, and the display panel provided by the solution shown in FIG. 4 has a widest border.

In one embodiment, along the direction parallel to the substrate 10, the minimum distance among the first distance D1 between the edge of the light extraction layer 30 and the edge of the thin film packaging layer 50, the second distance D2 between the edge of the first electrode 21 and the thin film packaging layer 50, and the third distance D3 between the edge of the protection layer 40 and the edge of the thin film packaging layer 50 is greater than or equal to 100 micron, and less than or equal to 500 micron. The maximum distance among the first distance D1, the second distance D2 and the third distance D3 is less than or equal to 1 mm.

In one embodiment, the minimum distance among the first distance D1, the second distance D2, and the third distance D3 is equal to a width of the thin film packaging layer 50 at a position of a border of the display panel along the direction parallel to the surface of the substrate 10. By arranging the minimum distance among the first distance D1, the second distance D2 and the third distance D3 greater than or equal to 100 micron, the thin film packaging layer 50 is ensured to have a suitable width at the position of the border, so that the water and oxygen resistance can be realized at the boundary of the thin film packaging layer, thereby ensuring that the display panel has a better thin film packaging effect. In addition, in this way, the preparation process of the organic layer and the inorganic layer in the thin film packaging layer can be better adapted, and the process difficulty is reduced, thereby reducing the preparation cost of the display panel. By arranging the minimum distance among the first distance D1, the second distance D2 and the third distance D3 is less than or equal to 500 micron, the display panel is ensured to have a relatively small border.

In addition, as can be seen in conjunction with FIG. 1 to FIG. 4, the border width D of the display panel D is equal to a sum of D4, D5, and the maximum value among D1, D2 and D3. Therefore, by arranging the maximum distance among D1, D2 and D3 less than or equal to 1 mm, the display panel is ensured to have a relatively small border.

Moreover, the specific value of the minimum distance among the first distance D1, the second distance D2, and the third distance D3 is not specifically limited in the present embodiment, and may be set according to the specific sizes of the different display panels and the specific process of the thin film packaging layer 50, for example, may set to be 150 micron, 200 micron, 250 micron, 300 micron, 350 micron or 400 micron. The specific value of the maximum distance among the first distance D1, the second distance D2 and the third distance D3 is also not specifically limited in the present embodiment, for example, may be set to be 500 micron, 600 micron, 700 micron, 800 micron or 900 micron.

In one embodiment, a difference value between the second distance D2 and the first distance D1 is less than or equal to 900 micron. In one embodiment, a difference value between the second distance D2 and the first distance D1 is less than or equal to 200 micron.

In one embodiment, the difference value between the second distance D2 and the first distance D1 may be set according to the specific size of the display panel. For the display panel having a smaller size, the difference value between the second distance D2 and the first distance D1 may be arranged to be less than or equal to 200 micron, so that the display panel is ensured to have a smaller border on the premise that the light extraction layer 30 is ensured to preferably protect the first electrode 21 from being corroded by the protection layer 40. For the display panel having a larger size, the difference value between the second distance D2 and the first distance D1 may be arranged to be less than or equal to 900 micron, thereby reducing the process difficulty.

In addition, the specific value of the difference value between the second distance D2 and the first distance D is not specifically limited in the present embodiment, and may be set according to the specific sizes of the different display panels, for example, may be arranged to be 10 micron, 20 micron, 50 micron, 100 micron, 150 micron, 300 micron, 400 micron, 500 micron, 600 micron, 700 micron or 800 micron, or the like.

In one embodiment, the display panel of the present embodiment is a top-emitting active-matrix organic light emitting diode (AMOLED) display panel. The first electrode 21 is the negative electrode.

In one embodiment, the first electrode 21 of the top-emitting AMOLED display panel adopts a planar electrode, which is easier to be corroded by the relatively active ions in the protection layer 40. By adopting the solution of the present disclosure, the protection layer 40 can be effectively prevented from corroding the first electrode 21 to affect the charge injection and fail the packaging, and the display performance of the display panel is improved.

The display panel of the present embodiment is not limited to the top-emitting AMOLED display panel, and is also applicable to other display panels having the problem that the electrode is easy to be corroded by the protection layer. For example, the display panel may also be a bottom-emitting AMOLED display panel, or a passive matrix organic light emitting diode (PMOLED) display panel, or the like. A shape of the first electrode 21 may be adjusted according to the structural requirements of the display panel. For example, in the PMOLED display panel, the first electrode is a strip negative electrode.

Figure 5:
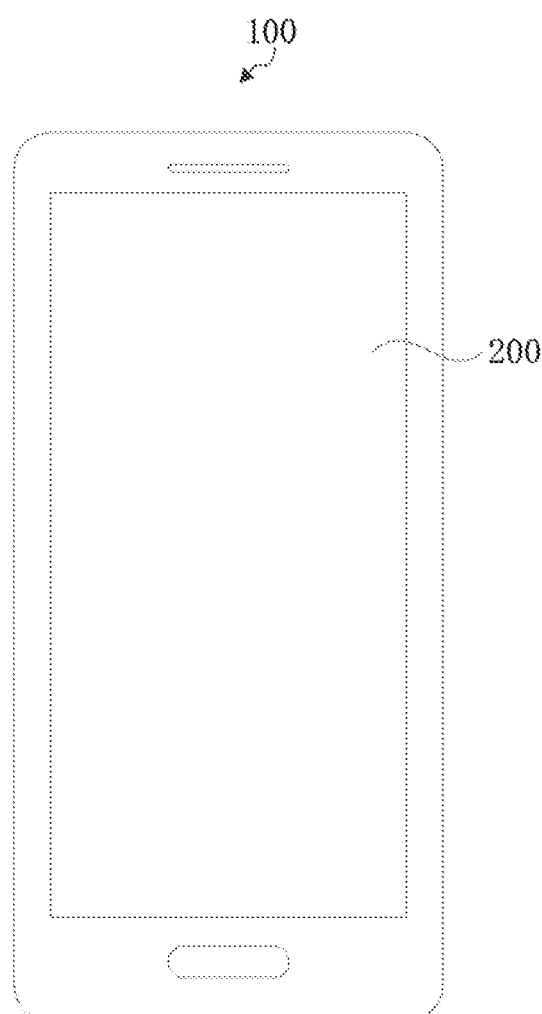
FIG. 5 is a schematic diagram illustrating a display device provided by one embodiment.

A display device is further provided by the present embodiment. FIG. 5 is a schematic diagram illustrating a display device provided by one embodiment. Referring to FIG. 5, the display device 100 includes the display panel 200 provided by any embodiment of the present disclosure. The display device 100 may be a mobile phone, a tablet computer, a virtual reality (VR) display product, a wearable product such as a smart wristband and a smart watch, or an in-vehicle display product, or the like.

What is claimed is:

1. A thin film packaging layer coated display panel, comprising:
   a substrate, an organic light emitting structure, a first electrode, a light extraction layer, a protection layer, and a thin film packaging layer, which are stacked in sequence;
   wherein the organic light emitting structure, the first electrode, the light extraction layer and the protection layer are coated by the thin film packaging layer; the light extraction layer is located between the protection layer and the first electrode, and completely isolates the protection layer and the first electrode;
   the display panel is a bottom-emitting active-matrix organic light emitting diode (ALMOLED) display panel or a passive matrix organic light emitting diode (PMOLED) display panel.

2. The display panel according to claim 1, wherein along a direction parallel to a surface of the substrate, a distance between an edge of the light extraction layer and an edge of the thin film packaging layer is a first distance; a distance between an edge of the first electrode and the edge of the thin film packaging layer is a second distance; a distance between an edge of the protection layer and the edge of the thin film packaging layer is a third distance; the first distance is less than or equal to the second distance.

3. The display panel according to claim 2, wherein the third distance is equal to the first distance;
   or, the third distance is equal to the second distance;
   or, the first distance is equal to the second distance and equal to the third distance;
   or, the third distance is less than the first distance, and the first distance is less than the second distance.

4. The display panel according to claim 2, wherein the first distance is less than the second distance; the third distance is greater than the first distance, and less than the second distance.

5. The display panel according to claim 2, wherein the first distance is equal to the second distance, and the third distance is less than the first distance.

6. The display panel according to claim 2, wherein
   the first distance, the second distance and the third distance satisfy at least one of the following:
   a minimum distance among the first distance, the second distance, and the third distance is greater than or equal to 100 micron, and less than or equal to 500 micron; or
   a maximum distance among the first distance, the second distance, and the third distance is less than or equal to 1 mm.

7. The display panel according to claim 2, wherein a difference value between the second distance and the first distance is less than or equal to 900 micron.

8. The display panel according to claim 7, wherein the difference value between the second distance and the first distance is less than or equal to 200 micron.

9. The display panel according to claim 1, wherein a material adopted by the protection layer is lithium fluoride.

10. The display panel according to claim 1, wherein a lip it transmittance of the first electrode is greater than 80%.

11. The display panel according to claim 1, wherein a material of the first electrode comprises at least one of the following: a mixture of magnesium and silver, indium tin oxide, indium zinc oxide, silver-doped indium tin oxide, or sliver-doped indium zinc oxide.

12. The display panel according to claim 1, wherein the display panel is the POLED display panel, and the first electrode is a strip negative electrode.

13. A thin film packaging layer coated display device, comprising a display panel, wherein
the display panel comprises a substrate, an organic light emitting structure, a first electrode, a light extraction layer, a protection layer, and a thin film packaging layer, which are stacked in sequence;
wherein the organic light emitting structure, the first electrode, the light extraction layer and the protection layer are coated by the thin film packaging layer; the light extraction layer is located between the protection layer and the first electrode, and completely isolates the protection layer and the first electrode;
wherein along a direction parallel to a surface of the substrate, a distance between an edge of the light extraction layer and an edge of the thin film packaging layer is a first distance; a distance between an edge of the first electrode and the edge of the thin film packaging layer is a second distance: a distance between an edge of the protection layer and the edge of the thin film packaging layer is a third distance; the first distance is less than or equal to the second distance;
wherein the third distance is equal to the first distance;
or, the third distance is equal to the second distance;
or, the first distance is equal to the second distance and equal to the third distance;
or, the third distance is less than the first distance, and the first distance is less than the second distance.

14. The display device according to claim 13, wherein the first distance is equal to the second distance, and the third distance is less than the first distance.

15. A thin film packaging layer coated display panel, comprising:
a substrate an organic light emitting structure, a first electrode, a light extraction layer, a protection layer, and a thin film packaging layer, which are stacked in sequence;
wherein the organic light emitting structure, the first electrode, the light extraction layer and the protection layer are coated by the thin film packaging layer; the light extraction layer is located between the protection layer and the first electrode, and completely isolates the protection layer and the first electrode;
wherein along a direction parallel to a surface of the substrate, a distance between an edge of the light extraction layer and an edge of the thin film packaging layer is a first distance: a distance between an edge of the first electrode and the edge of the thin film packaging layer is a second distance; a distance between an edge of the protection layer and the edge of the thin film packaging layer is a third distance; the first distance is less than or equal to the second distance,
wherein the first distance is less than the second distance; the third distance is greater than the first distance, and less than the second distance.

\* \* \* \* \*